United States Patent
Yamada

(10) Patent No.: US 10,937,501 B2
(45) Date of Patent: Mar. 2, 2021

(54) MEMORY DEVICE AND METHOD OF OPERATION

(71) Applicant: Micron Technology, Inc., Boise, ID (US)

(72) Inventor: Shigekazu Yamada, Suginamiku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/574,669

(22) Filed: Sep. 18, 2019

(65) Prior Publication Data

US 2020/0013467 A1 Jan. 9, 2020

Related U.S. Application Data

(63) Continuation of application No. 16/021,964, filed on Jun. 28, 2018, now Pat. No. 10,446,236.

(51) Int. Cl.
| | |
|---|---|
| G11C 16/08 | (2006.01) |
| G11C 16/30 | (2006.01) |
| G11C 16/04 | (2006.01) |
| G11C 16/14 | (2006.01) |
| G11C 16/26 | (2006.01) |
| G11C 16/10 | (2006.01) |
| G11C 5/14 | (2006.01) |
| G11C 16/32 | (2006.01) |
| G11C 11/56 | (2006.01) |

(52) U.S. Cl.
CPC .............. *G11C 16/08* (2013.01); *G11C 5/148* (2013.01); *G11C 16/0483* (2013.01); *G11C 16/10* (2013.01); *G11C 16/14* (2013.01); *G11C 16/26* (2013.01); *G11C 16/30* (2013.01); *G11C 11/5621* (2013.01); *G11C 11/5671* (2013.01); *G11C 16/32* (2013.01)

(58) Field of Classification Search
CPC ......... G11C 16/08; G11C 5/148; G11C 16/30; G11C 16/0483; G11C 16/14; G11C 16/26; G11C 16/10; G11C 11/5621; G11C 11/5671; G11C 16/32
See application file for complete search history.

(56) References Cited

U.S. PATENT DOCUMENTS

| | | | |
|---|---|---|---|
| 6,040,610 A | 3/2000 | Noguchi et al. | |
| 10,446,236 B1 | 10/2019 | Yamada | |
| 2002/0191472 A1* | 12/2002 | Okamoto | G11C 5/147 365/227 |

* cited by examiner

*Primary Examiner* — Jay W. Radke
(74) *Attorney, Agent, or Firm* — Schwegman Lundberg & Woessner, P.A.

(57) ABSTRACT

Discussed herein are systems and methods for charging an access line to a nonvolatile memory cell during a standby state, such as to prevent or mitigate standby-state charge loss. An embodiment of a memory device comprises a memory cell, a string driver circuit, and a charging circuit. The string driver circuit is coupled to the memory cell via a local word line, and has a common p-well. The charging circuit, in response to a voltage of a global word line of the memory device falling below a reference voltage during a standby state, couple a supply voltage to the common p-well of the string driver circuit to charge the global word line to a positive bias potential. The memory device includes a leakage compensation circuit to compensate for the junction leakage.

20 Claims, 12 Drawing Sheets

MEMORY DEVICE AND METHOD OF OPERATION

PRIORITY APPLICATION

This application is a continuation of U.S. application Ser. No. 16/021,964, filed Jun. 28, 2018, which is incorporated herein by reference in its entirety.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
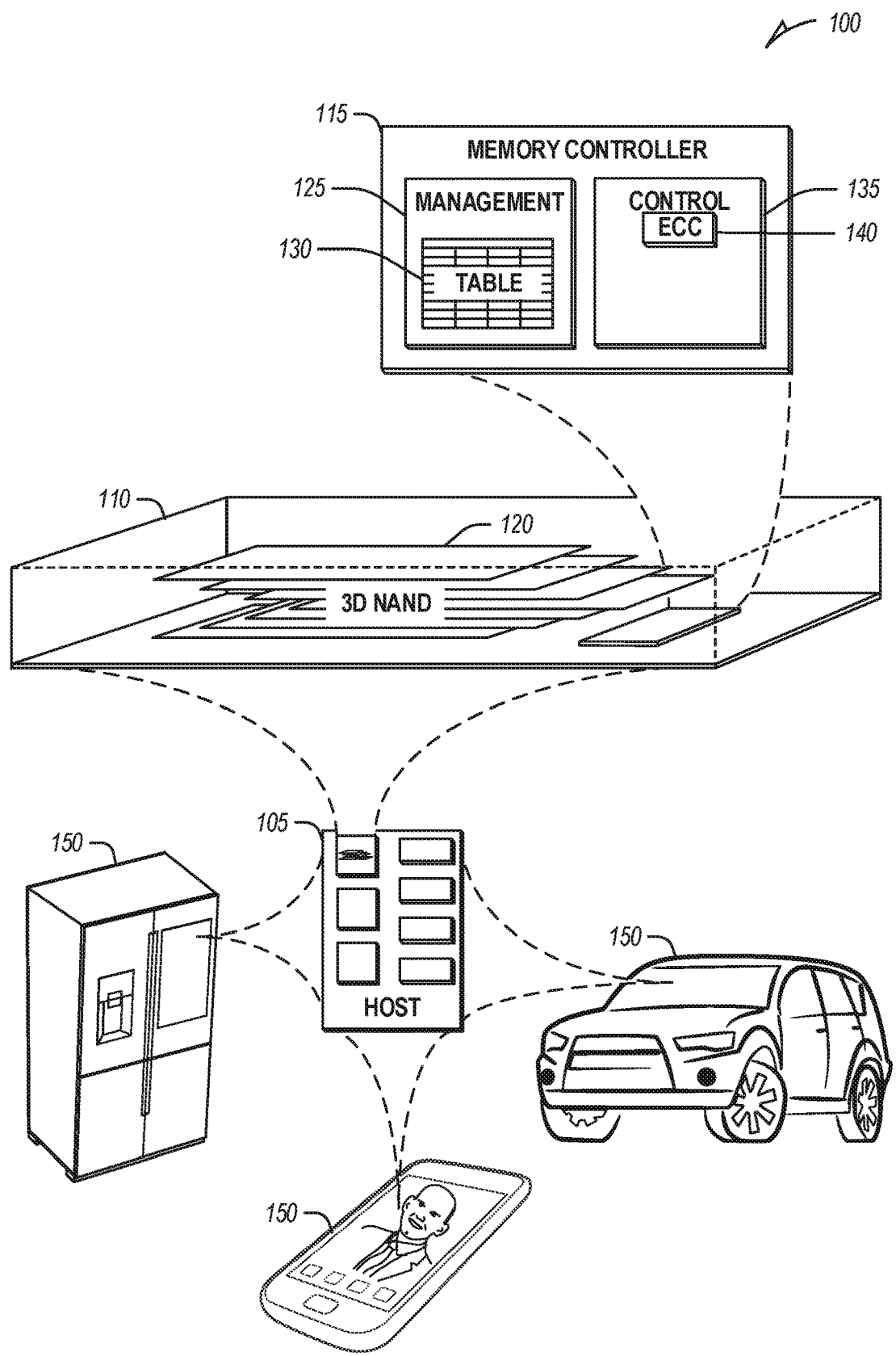
FIG. 1 illustrates an example of an environment including a memory device.

During a typical programming operation of a flash memory cell (e.g., a NAND flash memory), a selected word line coupled to the selected memory cell to be programmed is biased with a series of incrementing voltage programming pulses that start at an initial voltage that is greater than a predetermined programming voltage ($V_{PGM}$) (e.g., approximately 16V). The programming pulse increases a charge level thereby increasing the cell threshold voltage Vt, on a floating gate of the memory cell. A charge pump circuit may be used in a non-volatile memory device such as a NAND flash memory to generate the voltages required for chip operation. A charge pump is an electronic circuit that uses capacitors as energy storage elements to convert DC voltages into other DC voltages. After each programming pulse, a verification operation with a word line voltage of 0V is performed to determine if the cell threshold voltage has increased to the desired programmed level.

In three-dimensional (3D) architecture semiconductor memory technology, charge loss during a standby state has become a technical challenge. For example, immediately after programming, the floating gate can experience multiple forms of charge loss due to defects that occur at the time of ion implantation that can cause defects in the data retention characteristics of the floating gate. Charge loss during a standby state may include single-bit charge loss, intrinsic charge loss, and quick charge loss. Single-bit charge loss is the result of a defective memory cell that exhibits electron leakage. This leakage can be accelerated with voltage or high temperature stress and results in inferior data retention. Intrinsic charge loss is an immediate leakage of electrons from the floating gate, closest to the tunnel oxide, after a programming pulse. The trapped charge initially causes the cell Vt to appear higher than the floating gate is programmed. The leakage of these electrons after programming then causes a one-time shift in the threshold voltage.

Quick charge loss (QCL) is the result of electrons trapped in the tunnel oxide layer moving back into the channel region after the programming pulse. In an example, QCL may occur in a floating gate of a non-volatile memory device, such as a NAND flash memory cell. When a cell passes the verify operation, the cell is inhibited from further programming, and QCL begins. The decay of cell charge depends on the time elapsed from the last programming pulse. QCL may also cause an immediate Vt shift after a programming pulse. When the cell is read after the program operation has been completed, the cell has a Vt that is lower than the Vt obtained during the program verify operation. This can require an enlargement of the Vt distribution in order to accommodate all possible threshold voltages for a given state.

One possible solution to mitigate the charge loss is to provide a positive voltage on the access lines (e.g., word lines for accessing the memory cells) during the standby state. Such a positive voltage can relax electric field such as between the base and emitter of a bipolar junction transistor (BJT) or between gate and source of a metal-oxide-semiconductor field-effect transistor (MOSFET). As the potential applied to the word lines goes higher, less and/or slower charge loss may result. However, the higher potential may cause something more than charge retention, such as an undesired effect of charge gain on some memory cells. For example, when the word line voltage exceeds 2.5-3V, lower level word lines (e.g., WL0 or WL1) may be more susceptible to undesired charge gain. Charge gain may have a negative impact on the memory performance. The presence of an upper limit for the word line bias voltage, along with the tradeoff between memory performance and the QCL reduction, suggests that it is necessary to regulate the bias voltage on the word lines during the standby state.

Compared to other operational states of a memory device (e.g., program, erase, or read states), system resources may be more limited to achieve desirable QCL reduction while maintaining adequate memory performance (e.g., preventing charge gains on floating gates of some memory cells). During standby state, the memory device generally has no circuits that consume much current (e.g., charge pump) due to the limitation of standby current. The only available voltage sources during the standby state are internal common-collector voltage ($V_{CC}$) and external $V_{CC}$ ($V_{CC\_EXT}$). Additionally, state machine is inactive during the standby state, critical timing may not be utilized as in other operational states.

The present inventor has recognized the challenge of mitigating standby charge loss particularly under the constraint of system resources during the standby state. Moreover, it is recognized that biasing the word line with a simple source-follower (e.g., directly coupling the available supply voltage such as $V_{CC\_EXT}$ to the word lines) may not provide desired QCL reduction at least in some memory cells. For example, in a typical 3D NAND flash memory architecture. $V_{CC\_EXT}$ can be as low as 2-3 V (e.g., 2.35V). This voltage is usually not high enough to boost all the word lines. At the worst corner, for example, a word line bias voltage can be as low as 0.2V such that it is insufficient to retain charges. Additionally, with this source-follower type, the charging speed can be significantly slow, and the bias voltage may not be stabilized.

As to be discussed in various embodiments of the present documents, the present inventor has recognized a technical solution to mitigate charge loss during a standby state. In various embodiments, this document discusses, among other things, a memory device that can operate during a standby state when one or more access lines are operatively biased at a designated voltage to prevent or reduce charge loss during the standby state. The memory device comprises an array of memory cells such as NAND flash memory cells, a plurality of access lines such as word lines in communication with the memory cells, and a control circuit to selectively apply positive bias potentials to the access lines during a standby state. The memory device includes a charging circuit to establish positive bias on the access lines by self-boosting, or by charging a common p-well on a substrate. A leakage compensation circuit is used to compensate for the junction leakage, and to keep the access line voltage at a desired level for a long period of standby state. Methods of forming such apparatus are also disclosed, as well as methods of operation, and other embodiments.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120. The memory array 120 may include a number of individual memory die (e.g., a two-dimensional (2D) NAND die, or a stack of three-dimensional (3D) NAND die). Traditionally, the memory arrays 120 are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
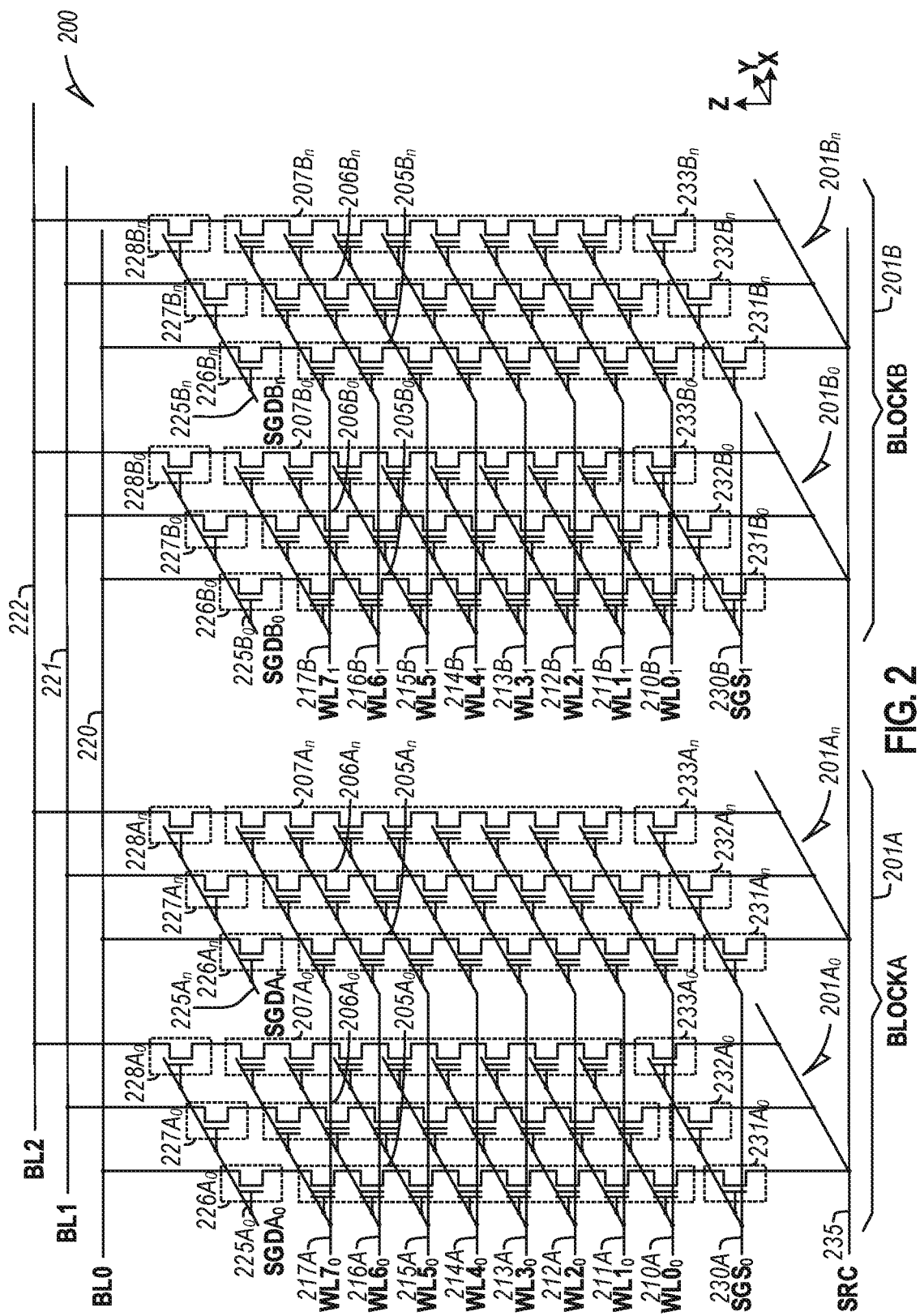
FIGS. 2-3 are schematic diagrams illustrating examples of NAND architecture semiconductor memory array.

FIG. 2 is a schematic diagram illustrating an example of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ 225B. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
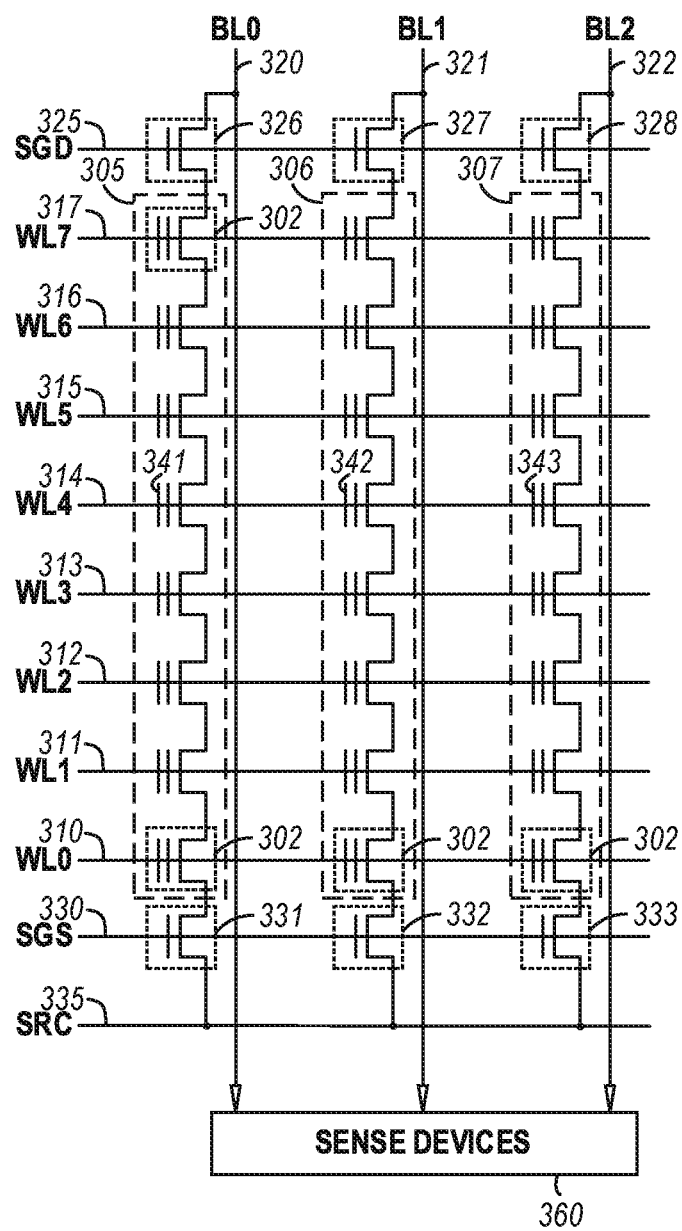

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage ($V_{PASS}$) can be applied to one or more word lines having memory cells that are not targeted for programming, or an inhibit voltage (e.g., $V_{CC}$ can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage ($V_{CC}$), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
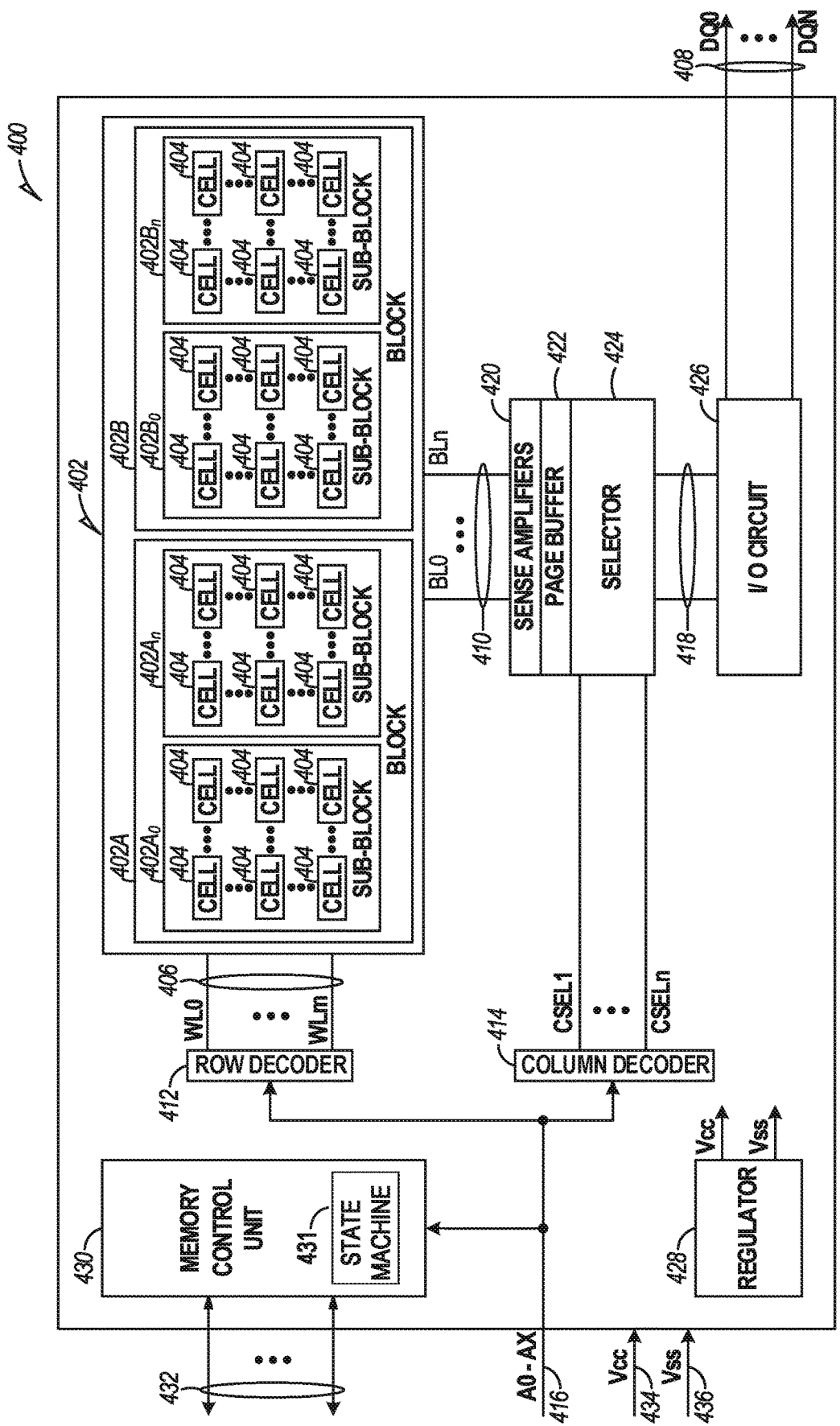
FIG. 4 is a block diagram illustrating an example of a memory module.

FIG. 4 is a block diagram illustrating an example of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 may include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage ($V_{CC}$) 434 and a negative supply ($V_{SS}$) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

During a standby or idle state, reducing charge loss such as QCL is generally desired. Biasing the access lines (e.g., GWLs) of the memory cells with a positive voltage can relax base-to-emitter electric field or gate-to-source electric field, and mitigate standby QCL. Nonetheless, there are certain circumstances in which more efficient QCL prevention is desired, particularly under the constraint of system resources during the standby state. For example, a simple source-follower (e.g., directly coupling the available supply voltage such as $V_{CC\_EXT}$ to the word lines) may not provide desired QCL reduction at least in some memory cells, because the $V_{CC\_EXT}$ may not be high enough to boost all the word lines at the worst corner, for example, a word line bias voltage can be as low as 0.2V such that it is insufficient to retain charges. Additionally, with this source-follower type, the charging speed can be significantly slow, and the bias voltage may not be stabilized. Various examples discussed in the present document may mitigate charge loss during a standby or idle state, such as by using a charging circuit to charge access lines via self-boosting, or by charging a common p-well on a substrate, to establish positive bias on the access lines, and by using a leakage compensation circuit to maintain the access line voltage on the access line to be substantially the positive bias potential, as to be discussed in the following in reference to FIGS. 5-11.

Figure 5:
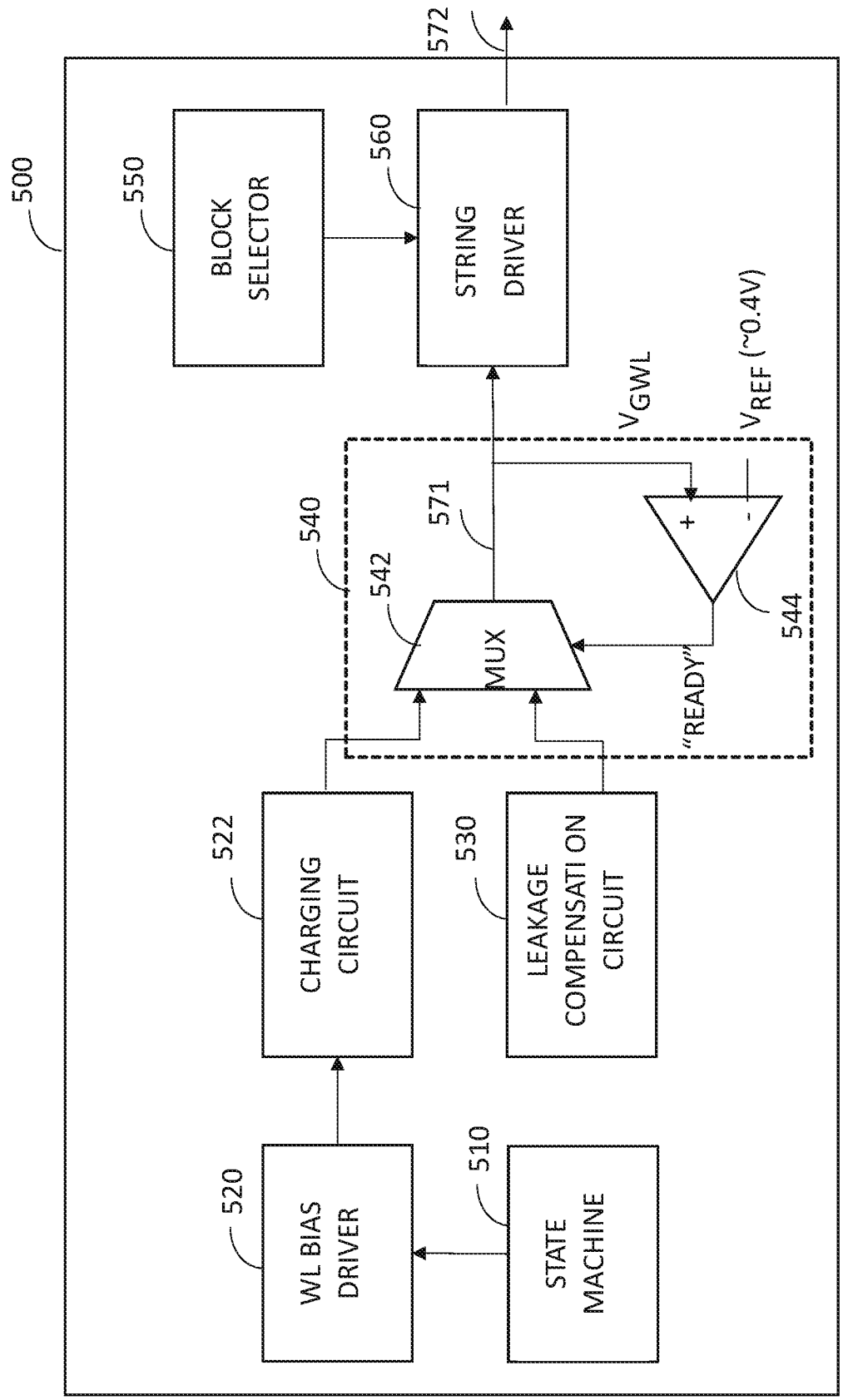
FIG. 5 is a block diagram illustrating an example of an access line voltage regulation unit configured to regulate voltages on one or more access lines.

FIG. 5 is a block diagram illustrating an example of an access line voltage regulation unit 500 configured to regulate voltages on one or more access lines, such as the global word line (GWL) 571 and local word line (LWL) 572, during a standby state. Part of the access line voltage regulation unit 500 can be a part of the memory control unit 430. The access line voltage regulation unit 500 includes a state machine 510, which can be an embodiment of the state machine 431. The state machine 510 may provide an indication of system operational state, such as a specific operational state (e.g. a program state, an erase state, or a read state), or a standby state absent of specific memory operations. In some examples, the state machine 510 can receive a user command, such as via a user interface, of an indication of a standby state. The word line (WL) bias driver 520 may include a multiplexer (MUX) to selectively couple the supply voltage $V_{CC}$ or a high voltage source (HV) to the access lines. The HV source may include a charge pump or an external supply voltage $V_{CC\_EXT}$ configured to provide a voltage higher than $V_{CC}$. During a specific memory operational state (e.g., program, erase, or read), the HV source can be selected to bias the access lines to a voltage of HV-Vth (where Vth is the threshold voltage). In an example, the WL bias driver 520 controls the GWL 571 to have different voltages appropriate for erase, program, and read operations.

During the standby state, $V_{CC}$ is the only voltage source available to charge the access line. The WL bias driver 520 uses $V_{CC}$ to charge the access lines through a self-boosting mechanism via a charging circuit 522, resulting in a voltage $V_{CC}$–Vth on the access line. In various examples, the charging circuit 522 may comprise a metal-oxide-semiconductor (MOS) device of an adjustable size. Depending on the total current ($I_{CC}$) allowed for charging, the size of the MOS device may be adjusted to trim the charging current accordingly. For example, if a large current $I_{CC}$ is allowed, a larger MOS device may be used to increase charging speed. If a lower charging current is desired, the size of the MOS device may be reduced to decrease charging speed.

The block selector 550 may perform block decoding to electrically turn on and off groups of the switches/transistors in the string driver 560. As a result, even if the WL bias driver 520 generates GWL voltages that could be coupled to multiple LWLs in a same intermediate plane, the block selector 550 can turn on only a selected subset of the string driver switches/transistors, thereby turning on only a selected subset of the LWLs in the same intermediate plane. The string driver 560 may include switches or transistors that operatively couple the GWL 571 to, or decouple the GWL 571 from, the LWL 572. The LWL 572 may be coupled to a number of memory cells, such as a plurality of NAND flash memory cells. During specific memory operations, through the GWL 571 and the string driver 560, the WL bias driver 520 can provide voltages to power the LWLs, thus access different memory cells and fulfill operations such as erase, program and read.

During the standby state, the WL bias driver 520 may charge the access lines to a target voltage via the charging circuit 522. However, charge leakage may occur at various junctions around the access lines, such as the junctions on the drain or source of a MOS transistor in the string driver 560. As a result, the targeted voltage on GWL 571 may be gone eventually, since the targeted voltage is basically left floating. To prevent or mitigate junction leakage, the access line voltage regulation unit 500 includes a leakage compensation circuit 530 to compensate for the junction leakage. The leakage compensation circuit 530 may keep the charged voltage on GWL 571 at a desired level for a long period of standby state. In an example, the leakage compensation circuit 530 may include a diode-connected current path. Examples including the leakage compensation are discussed below, such as with reference to FIGS. 10 and 11.

The charging circuit 522 and the leakage compensation circuit 530 may be fed into a selector unit 540, which includes a multiplexer (MUX) 542 and a comparator 544. The comparator 544 is configured to compare a voltage $V_GWL$ sampled from the GWL 571 to a reference voltage $V_{REF}$. In an example, $V_{REF}$ is a specified target voltage, such as approximately 0.7V. In another example, $V_{REF}$ may be adjustable as desired, such as between approximately 0.2V-0.7V. Output of the comparator 544 may be coupled to the selector pin of the MUX 542. When the $V_{GWL}$ reaches or exceed $V_{REF}$, the comparator output "READY" is set to logic "1". The MUX 542 may and electrically connect the leakage compensation circuit 530 to the GWL 571 to maintain a desired bias voltage on the GWL 571, such as approximately 0.4V in an example. In some examples, the reference voltage $V_{REF}$ is adjustable, such that the comparator 544 may adjust the boosting voltage on the access line to a desired target level such as $V_{REF}$.

Figure 6:
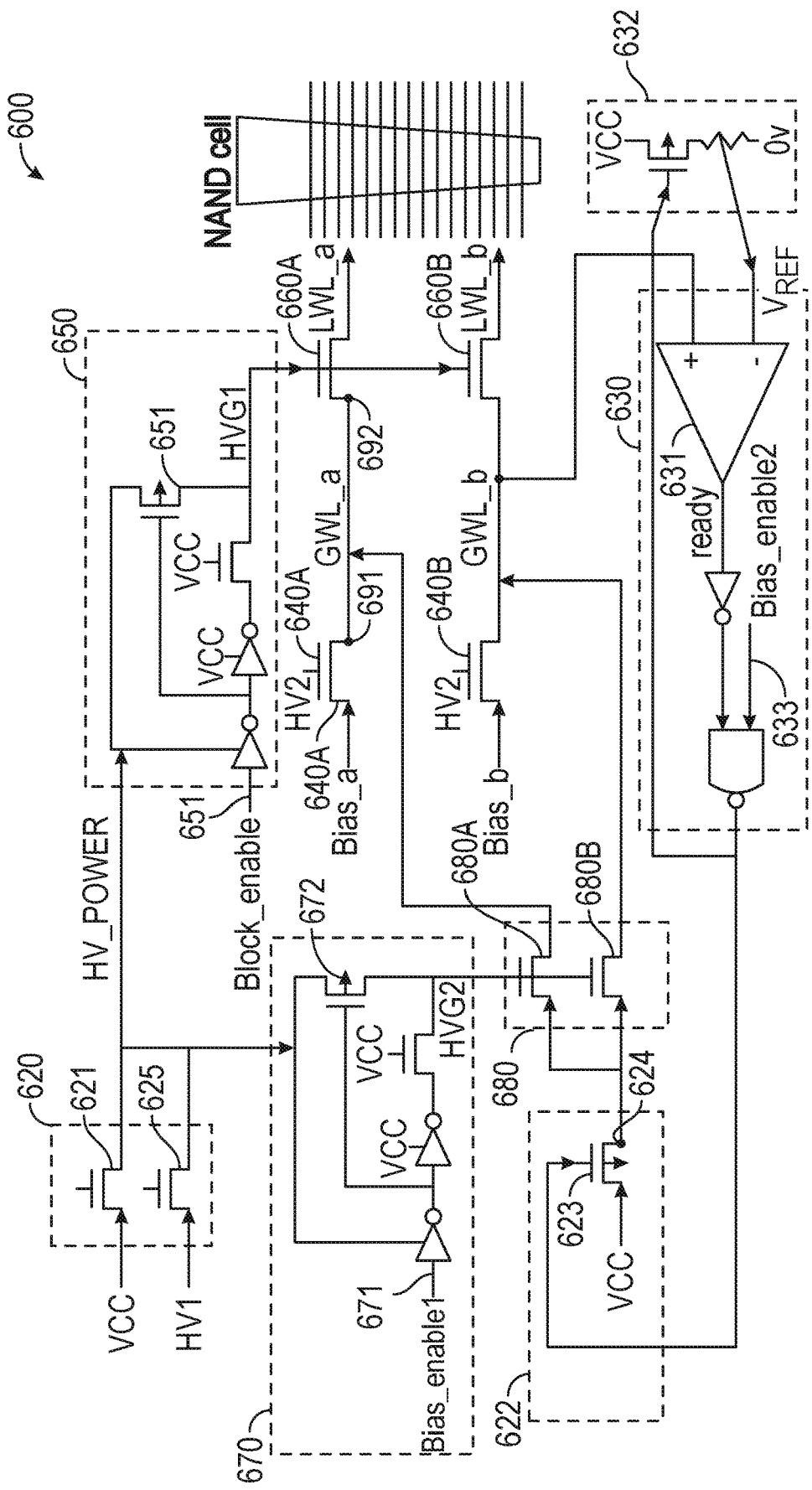
FIG. 6 is a schematic diagram illustrating an example of a word line (WL) bias regulator configured to bias an access line during a standby state.

FIG. 6 is a schematic diagram illustrating an example of a word line (WL) bias regulator 600 configured to bias an access line (e.g., a GWL or an LWL) during a standby state. The WL bias regulator 600, which represents an embodiment of at least a portion of the access line voltage regulation unit 500, may include one or more of a high-voltage MUX 620, a block selector 650, a GWL charge driver 670, a charging path 622, and a feedback charge control circuit 630. The high-voltage MUX 620, which represents an embodiment of the WL bias driver 520, selects between a high voltage source HV1 (e.g., a charge pump or an external power source) and the supply voltage $V_{CC}$ via a pair of switches/transistors 621 and 625. During special memory operational states (e.g., read, program, or erase), the switch/transistor 625 conducts, thereby connecting HV1 to the block selector 650 and the GWL charge driver 670. Different bias voltages may be applied to the GWLs and thus the corresponding LWLs to fulfill operations of read, erase, or program. During the standby state, the switch/transistor 621 conducts, connecting $V_{CC}$ to the block selector 650 and the GWL charge driver 670.

The block selector 650, which represents the block selector 550 of FIG. 5, may produce a block selection voltage HVG1 in accordance with a "block_enable" signal 651. The block selection voltage HVG1 is applied to the control gates of a plurality of transistors of the string drivers 660A-660N (e.g., 660A and 660B as shown) to electrically turn on and off the respective string drivers. In an example as illustrated, the string drivers 660A-660N may be high voltage NMOS (HVNMOS) transistors. During the standby state, $V_{CC}$ is selected by the MUX 620 and applied to the block selector 650. When the block_enable is set to logic "1", PMOS transistor 651 conducts, and transmits $V_{CC}$ to the control gates of the string drivers 660A-660N. The block selection voltage HVG1 is approximately $V_{CC}$-Vth, which is high enough to turn on the HVNMOS transistors 660A-660N. The voltages on the GWLs (e.g., GWL_a, GWL_b, etc.) may then be transmitted to the corresponding LWLs (e.g., LWL_a, LWL_b, etc.).

The GWLs are each connected to respective transistors 640A-640N, such as NMOS transistors as illustrated in FIG. 6. During specific memory operational states, control gate voltage HV2 (which may be supplied by a charge pump) of the NMOS transistors 640A-640N is set to high, allowing biasing voltages (e.g., Bias_a, Bias_b, etc) to be transmitted to the respective GWLs (e.g., GWL_a, GWL_b, etc.). During the standby state, HV2 is set to low (approximately 0V). The NMOS transistors 640A-640N are turned off, such that the biasing voltages are disconnected from the GWLs.

The GWL charge driver 670 has a similar circuit structure to the block selector 650, and is coupled to a self-boosting circuit 680 comprising a group of switches/transistors 680A-680N (e.g., 680A and 680B as shown). The GWL charge driver 670 may electrically turn on and off groups of switches/transistors 680A-680N in accordance with a bias_enable1 signal 671. In the illustrated example, the switches/transistors 680A-680N are HVNMOS transistors, and are each coupled to access lines GWL_a, GWL_b, etc., respectively. Compared to direct application of one common biasing voltage to multiple access lines, the switches/transistors 680A-680N may boost respective GWLs using respective HVNMOS transistors. This allows the biasing voltage to be effectively transmitted to the GWLs without any voltage drop. During the standby state, bias_enable1 is set to logic "1", such that PMOS transistor 672 conducts, and transmits $V_{CC}$ to the control gates of the transistors 680A-680N. The gating voltage HVG2 is approximately $V_{CC}$-Vth, which is high enough to turn on the HVNMOS transistors 680A-680N. The WL biasing voltage, such as that at node 624, may be transmitted to the access lines (e.g., GWL_a, GWL_b, etc.) via respective HVNMOS transistors (e.g., 680A, 680B, etc.).

The feedback charge control circuit 630 may include a comparator 631 configured to sample an access line voltage $V_{GWL}$ from a GWL, and compare it to a reference voltage $V_{REF}$. Any access line, such as any GWL, may be selected for voltage comparison. By way of non-limiting example, GWL_b is sampled as illustrated in FIG. 6. The $V_{REF}$ may be provided by a voltage divider 632. In an example, the voltage divider 632 includes a resistor-divided chain, such that a trimable $V_{REF}$ may be obtained by adjusting the resistance on the voltage divider 632. The feedback charge control circuit 630 may include logic gates that allow a control signal bias_enable2 633 to enable feedback control of the biasing voltage through logic gates in the feedback charge control circuit 630. Timing sequence of the control signals such as the block_enable 651, bias_enable1 671, and bias_enable2, along with other characteristic events, are discussed below, such as with reference to FIG. 7.

The feedback charge control circuit 630 is coupled to the charging path 622 to control the charging of access lines (e.g., GWLs). The charging path 622, which represents an embodiment of the charging circuit 522, includes a PMOS 623. In some examples, the size of the PMOS 623 may be adjusted according to the $I_{CC}$ allowed for charging. For example, a bigger PMOS 623 in size may correspond to faster charging speed, and vice versa. The output of the feedback charge control circuit 630 is coupled to the control gate of the PMOS 623 to electrically turn on and off the biasing voltage $V_{CC}$. For example, when the access-line voltage $V_{GWL}$ sampled from the GWL exceeds the $V_{REF}$, the comparator output a REDAY signal having a logic value of "1", and the feedback charge control circuit 630 outputs a high voltage that is applied to the gate of PMOS 623. Accordingly, PMOS 623 becomes non-conductive, and the biasing voltage $V_{CC}$ is prevented from being transmitted to node 624 at drain of PMOS 623. If the Bias_enable1 is set to "1" during the standby state, the gating voltage HVG2 is high, and the transistors 680A-680N conduct, such that the biasing voltage (e.g., approximately $V_{CC}$) at node 624 can be applied to the access lines, e.g., GWLs.

Figure 7:
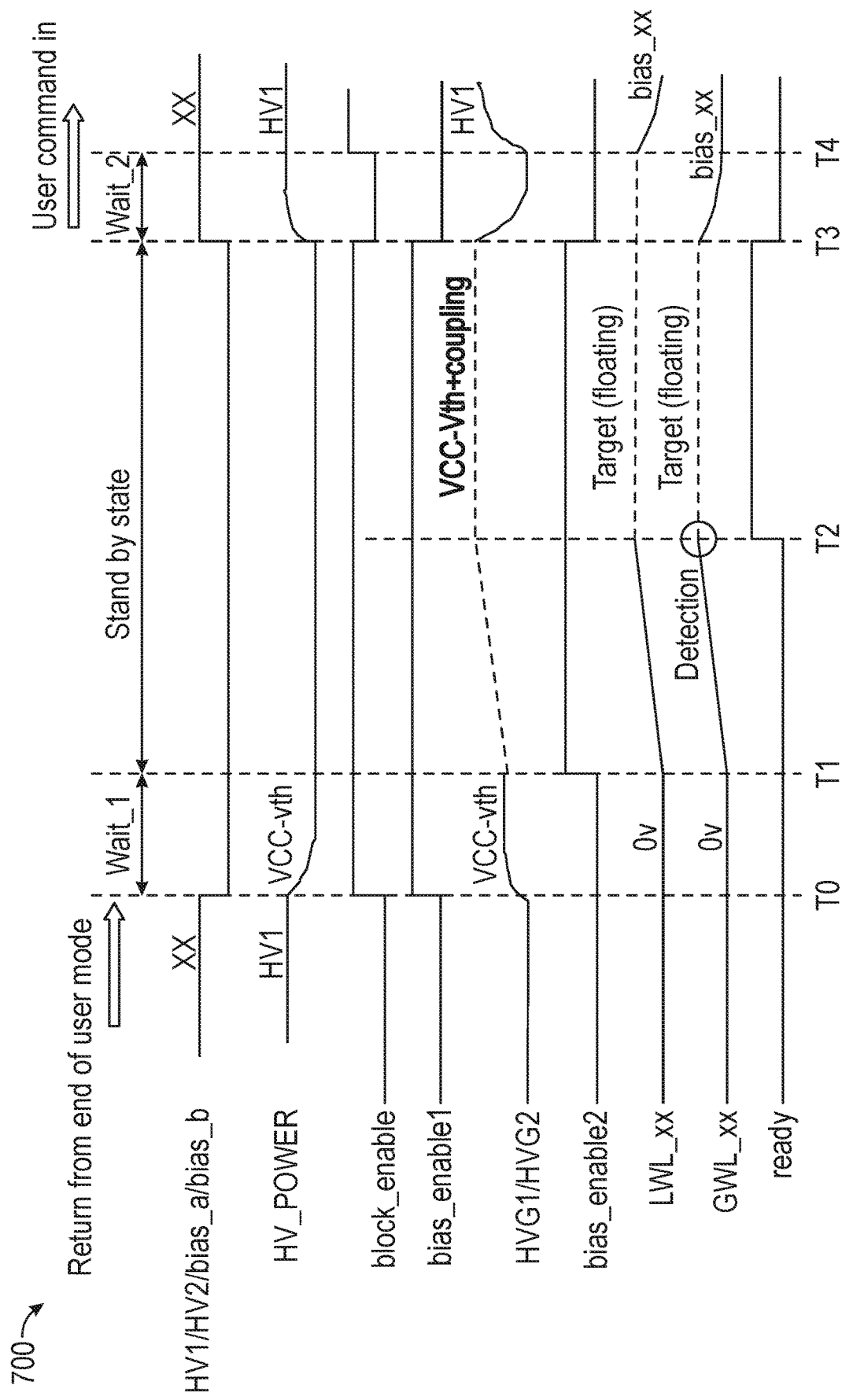
FIG. 7 is a timing diagram illustrating event timing of an embodiment of the WL bias regulator as shown in FIG. 6.

FIG. 7 is a timing diagram illustrating event timing of an embodiment of the WL bias regulator 600. At the end of the user mode (with user command), a specific wait time "wait_1" commences at time T0. The wait_1 is a warm-up period for potentials at various points (e.g., HV_power, HVG1, HVG2, etc.) to settle before entering a full standby state. The wait_1 period may be user specified. In some examples, wait_1 is approximately 5 micro-seconds (is). During wait_1, all of high-voltage sources, such as HV1 and HV2 supplied by charge pumps or external power sources, are off; and only state machine 510 is active. HV_power decays from HV down to $V_{CC}$-Vth due to the switching from HV to $V_{CC}$ at the MUX 620. Also at T0, control signals block_enable (for the block selector 650) and bias_enable1 (for the GWL charge driver 670) are both set to logic "1". The corresponding outputs HVG1 (output of the block selector 650) and HVG2 (output of the GWL charge driver 670) are both raised to a level comparable to HV_power, that is, ramping up to $V_{CC}$-Vth.

Upon completion of the wait_1 period, standby state commences at time T1. GWLs (annotated as "GWL_xx" which includes GWL_a, GWL_b, etc.) are charged via the charging path 622. Due to self-boosting, HVG1 and HVG2 are also raised due to coupling. As a result, HVG1-gated NMOS devices 660A-660N (e.g., 660A and 660B as shown), and HVG2-gated NMOS devices 680A-680N, are kept conductive throughout the standby state, no matter how high the targeted WL voltage is.

The feedback charge control circuit 630 may sample the voltage on a GWL. At time T2, the comparator 631 detects a target voltage (such as the trimable reference $V_{REF}$ as provided by the voltage divider 632) on the sampled GWL, annotated as "detection" and "Target (floating)" in FIG. 7. The comparator 631 gives out a "READY" signal, shutting off all remaining active circuits including transistor 623. The chip is in now in the standby state without any additional current. Through the feedback voltage control mechanism provided by the feedback charge control circuit 630, the voltage on the GWL may be maintained at the target level during the standby state. Because HVG1 remains high and open the string drivers 660A-660N, voltages at LWLs (annotated as "LWL_xx" which includes LWL_a, LWL_b, etc.) follow the voltages at corresponding GWLs. As such, WL bias voltages during a standby state may be well regulated at a target level to more effectively prevent or mitigate charge loss during the standby state.

At time T3, a user command is received, which terminates the standby state. The user command triggers the high-voltage MUX 620 to switch the voltage source from $V_{CC}$ back to HV1. HV1 and HV2 supplied by charge pumps or external voltage sources are back on. Control signals block_enable and bias_enable1 are set to logic "0", causing each of the block selector 650 and the GWL charge driver 670 to output a logic "0" or low voltage. HVG1 and HVG2 both fall back to low voltages. Bias_enable2 and "READY" from the comparator 631 both go to low, and the GWL voltage starts to drop from its target value. Because of low HVG1, string drivers 660A-660N are not conducting, such that LWL does not follow GWL during the time period "wait_2". The wait_2 period may be user specified. In an example, wait_2 is approximately 5 µs. Beginning at T4, block_enable is set to high, raising HVG1. As a result, string drivers 660A-660N are turned on. Bias voltages at the GWLs, such as bias_a, bias-b, etc. and annotated as "bias_xx" in FIG. 7, can then be transmitted to LWLs to fulfill a specific memory operation, such as a program, an erase, or a read operation.

Figure 8:
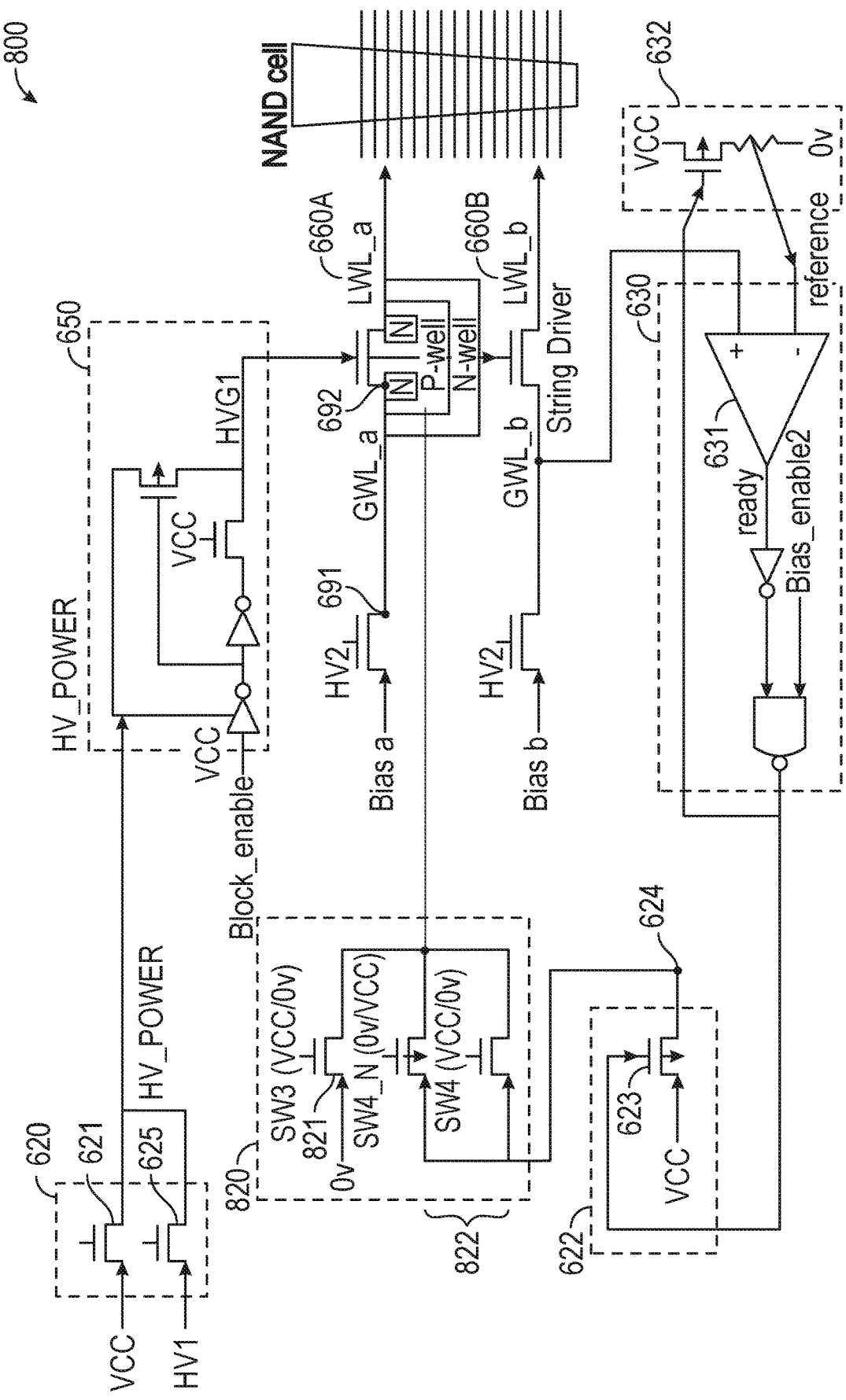
FIG. 8 is a schematic diagram illustrating an example of a WL bias regulator 800 configured to bias an access line based on a PN-diode forward biasing during a standby state.

FIG. 8 is a schematic diagram illustrating an example of a WL bias regulator 800 configured to bias an access line (e.g., GWL or LWL) based on a PN-diode forward biasing during a standby state. The WL bias regulator 800 may be an embodiment of at least a part of the access line voltage regulation unit 500. Unlike the WL bias regulator 600 that charges access lines (e.g., GWLs) directly using the supply voltage $V_{CC}$ via self-boosting, the WL bias regulator 800 charges access lines by charging a common p-well such as in the region of the NMOS string drivers 660A-660N.

Similar to the WL bias regulator 600, the WL bias regulator 800 includes the feedback charge control circuit 630 coupled to the voltage divider 632 to supply a reference voltage, and the charging path 622 to transmit the biasing voltage $V_{CC}$ to the node 624 at drain of PMOS 623. Instead of using the GWL charge driver 670 and the HVNMOS 680A-680N to directly apply biasing voltages to GWL as described above with reference to FIG. 6, the WL bias regulator 800 includes a multiplexer (MUX) 820 to select between a low operating voltage "0V" during a specific memory operational state, and a biasing voltage (provided by the feedback charge control circuit 630 and the charging path 622) during the standby state. The MUX 820 includes a NMOS 821 and a PMOS/NMOS pair 822. During normal memory operations, NMOS 821 is turned on to connect 0V to the p-well of each of the NMOS string drivers 660A-660N. During charging mode, MUX 820 operates to transmit the high biasing voltage $V_{CC}$-Vth from node 624 to the p-well. Such a voltage may forward-bias the PN-diode at the drain and source region (channel) of each of the NMOS devices 660A-660N. Accordingly, both GWLs and the LWLs may be charged up by the forward-biased PN-diode. Since the p-well never goes to high voltage, thin PMOS/NMOS 822 may be used. The combination of PMOS/NMOS 822 can transmit a wide range of target voltage to the p-well without voltage drop.

Figure 9:
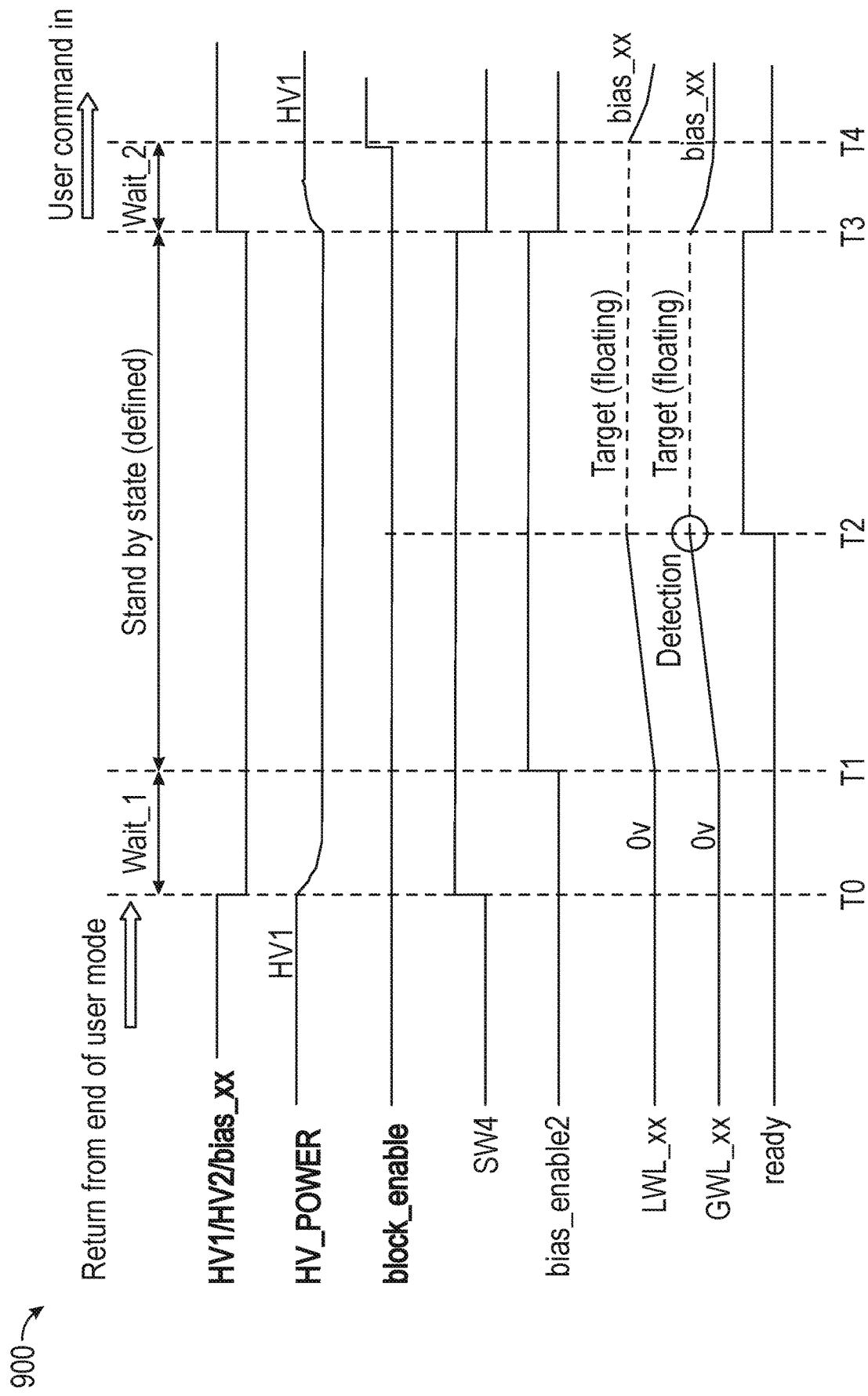
FIG. 9 is a timing diagram illustrating event timing of an embodiment of the WL bias regulator as shown in FIG. 8.

FIG. 9 is a timing diagram illustrating event timing of an embodiment of the WL bias regulator 800. During the wait time "wait_1", all of high-voltage sources, such as HV1 and HV2 supplied by charge pumps or external voltage sources, are off; and only state machine 510 is active. HV_power starts to decay from the high voltage HV1 down to $V_{CC}$-Vth due to the switch of the voltage from HV1 to $V_{CC}$ at the high-voltage MUX 620. As a warm-up, SW4 (the control voltage at the PMOS/NMOS 822) goes up to connect the charging path 622 to the p-well at the NMOS string drivers 660A-660N. Right before entering "standby-state", all p-well starts to be charged-up.

Standby state commences at time T1, when the state machine 510 becomes inactive. The p-well continues to be charged up during the standby state. As a result, both GWLs and LWLs are charged up to a level substantially equal to p-well voltage less a PN-diode drop. At time T2, the comparator 631 detects a target voltage (such as the trimable reference $V_{REF}$ as provided by the voltage divider 632) on the sampled GWL, and therefore responds and gives out "READY", shutting off all remaining active circuits. The chip is now in the standby state without any additional current. Through the feedback voltage control mechanism provided by the feedback charge control circuit 630, the voltage on the GWLs and LWLs established by p-well charging and PN-diode forward biasing may be maintained at the target level during the standby state.

During the standby state, the control signal block_enable for the block selector 650 maintains at 0V. HVG1 as the output of the block selector 650 also stays at 0V, such that the NMOS string drivers 660A-660N do not conduct during the standby state. In contrast to the WL bias regulator 600 in which the voltage at HVG1 is raised during the standby state to turn on the string drivers 660A-660N and to conduct the biasing voltages at GWLs to the corresponding LWLs, in the WL bias regulator 800, the charging of LWLs are GWLs are both provided by p-well charging and PN-diode forward biasing. The resulting WL bias voltages may be well regulated at a target level to more effectively prevent or mitigate charge loss during the standby state.

Although the WL bias regulator 600 in FIG. 6 and the WL bias regulator 800 in FIG. 8 each includes one block of GWLs selected for WL bias voltage regulation, this is meant to be examples by way of illustration and not limitation. In various examples, any number of blocks can be selected using similar apparatus and methods discussed herein during wait_1 as desired.

Figure 10:
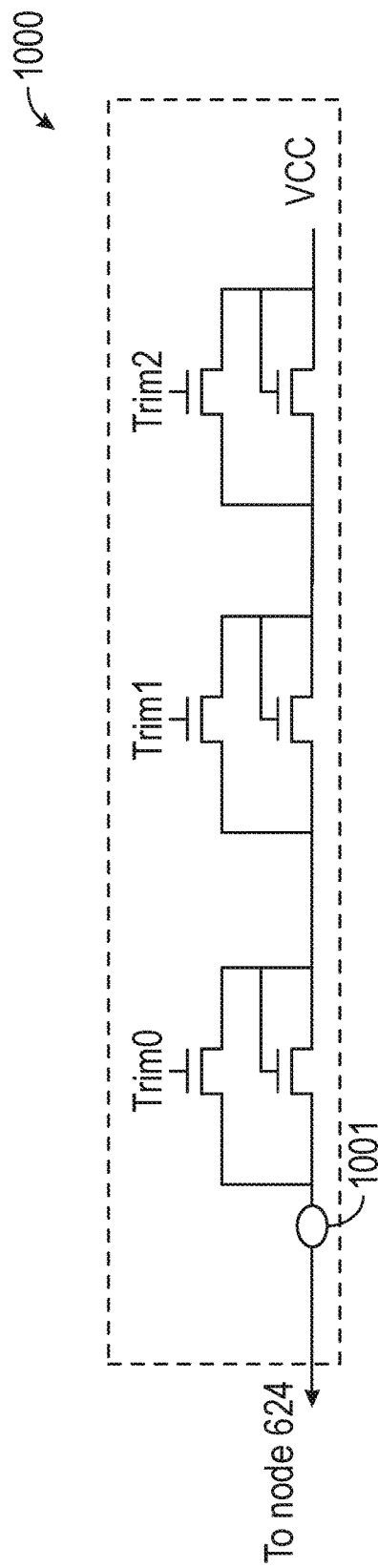
FIG. 10 is a schematic diagram illustrating an example of a leakage compensation circuit for compensating charge loss at the access lines during the standby state.

FIG. 10 is a schematic diagram illustrating an example of a leakage compensation circuit 1000 for compensating charge loss at the access lines (e.g., GWLs) during the standby state. Refer to FIGS. 6 and 8, charge leakage may occur at junctions of the GWLs, such as at node 691 of a HVG2 gated NMOS 640A-640N, or at node 692 of a HVG1 gated NMOS 660A-660N. Due to the junction leakage, the targeted voltage on the GWLs, as supplied by the charging path 622, may be left floating such that it may drop.

The leakage compensation circuit 1000 represents an embodiment of the leakage compensation circuit 530 as illustrated in FIG. 5. The leakage compensation circuit 1000 comprises a voltage-controlled diode-connected current path to compensate for charge loss at the junctions at the GWLs. The compensation circuit 1000 may be connected to the WL bias regulator 600 or the WL bias regulator 800 via node 1001, injecting charges at node 624 on the drain region of PMOS 623, as illustrated in FIGS. 6 and 8. When the voltage on GWLs (or LWLs) drops and reaches a specific threshold voltage, the leakage compensation circuit 1000 is turned on, raising GWLs (or LWLs) back to a voltage close to the target level. In various examples, the degree of compensation is adjustable, as indicated by Trim_0, Trim_1, Trim_2, etc. in FIG. 10. For example, turning on both Trim_0 and Trim_1 would result in a higher compensation current than turning on either Trim_0 or Trim_1 alone.

Figure 11:
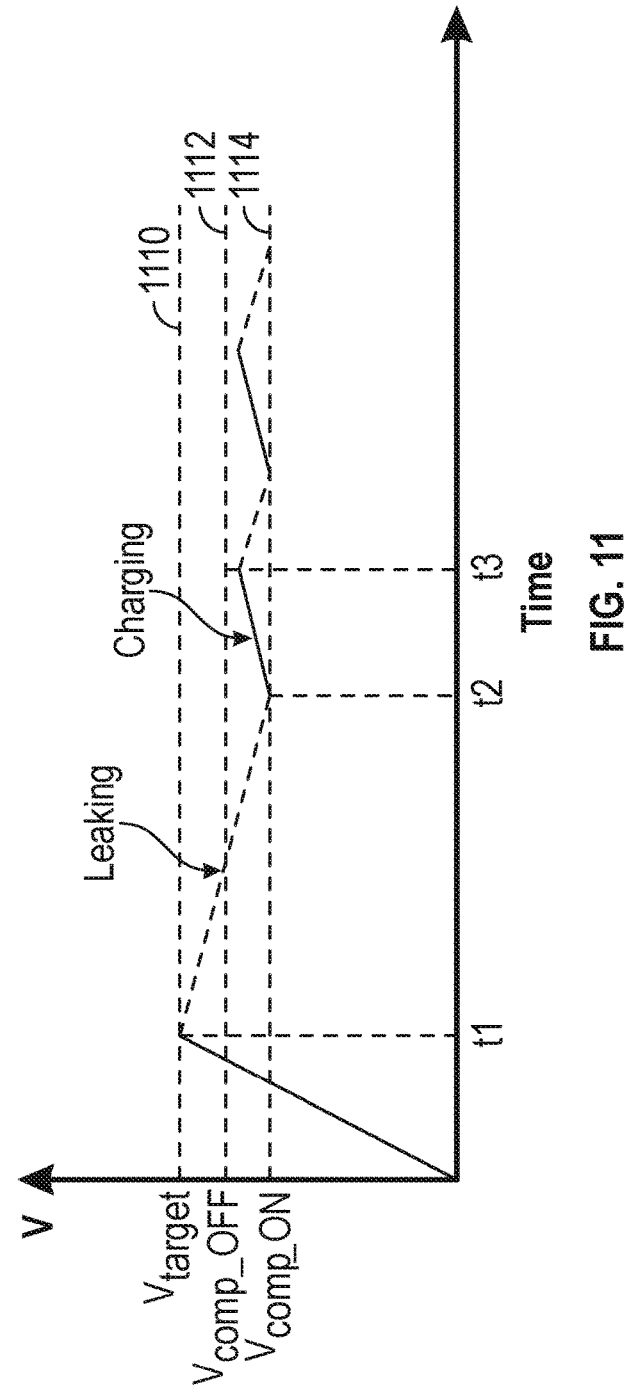
FIG. 11 is a diagram illustrating the biasing voltage applied to the access lines over time.

FIG. 11 is a diagram illustrating the biasing voltage applied to the GWL over time, as regulated by the charging circuitry (including the feedback charge control circuit 630 and the charging path 622) and the leakage compensation circuit 1000. The leakage compensation circuit 1000 may set an adjustable first voltage threshold ($V_{Comp\_OFF}$) 1112 for turning off the leakage compensation circuit 1000, and an adjustable second voltage threshold ($V_{Comp\_ON}$) 1114 for turning on the leakage compensation circuit 1000. During the standby state, the GWLs are charged up to the target voltage level 1110 at time t1. Leakage commences thereafter, causing the GWL voltage to drop. The voltage on GWL is sampled and compared to the second threshold $V_{Comp\_ON}$. When the GWL voltage reaches $V_{Comp\_ON}$ at time t2, the compensation circuit 1000 is turned on to charge GWL. When the GWL voltage ramps up to $V_{Comp\_OFF}$ at time t3, the compensation circuit 1000 is shut off; and junction leakage may start again. The leakage compensation circuit 1000 may thus maintain the GWL voltage within a desired range between $V_{Comp\_ON}$ and $V_{Comp\_OFF}$, such that the charge loss during the standby state may be mitigated.

Figure 12:
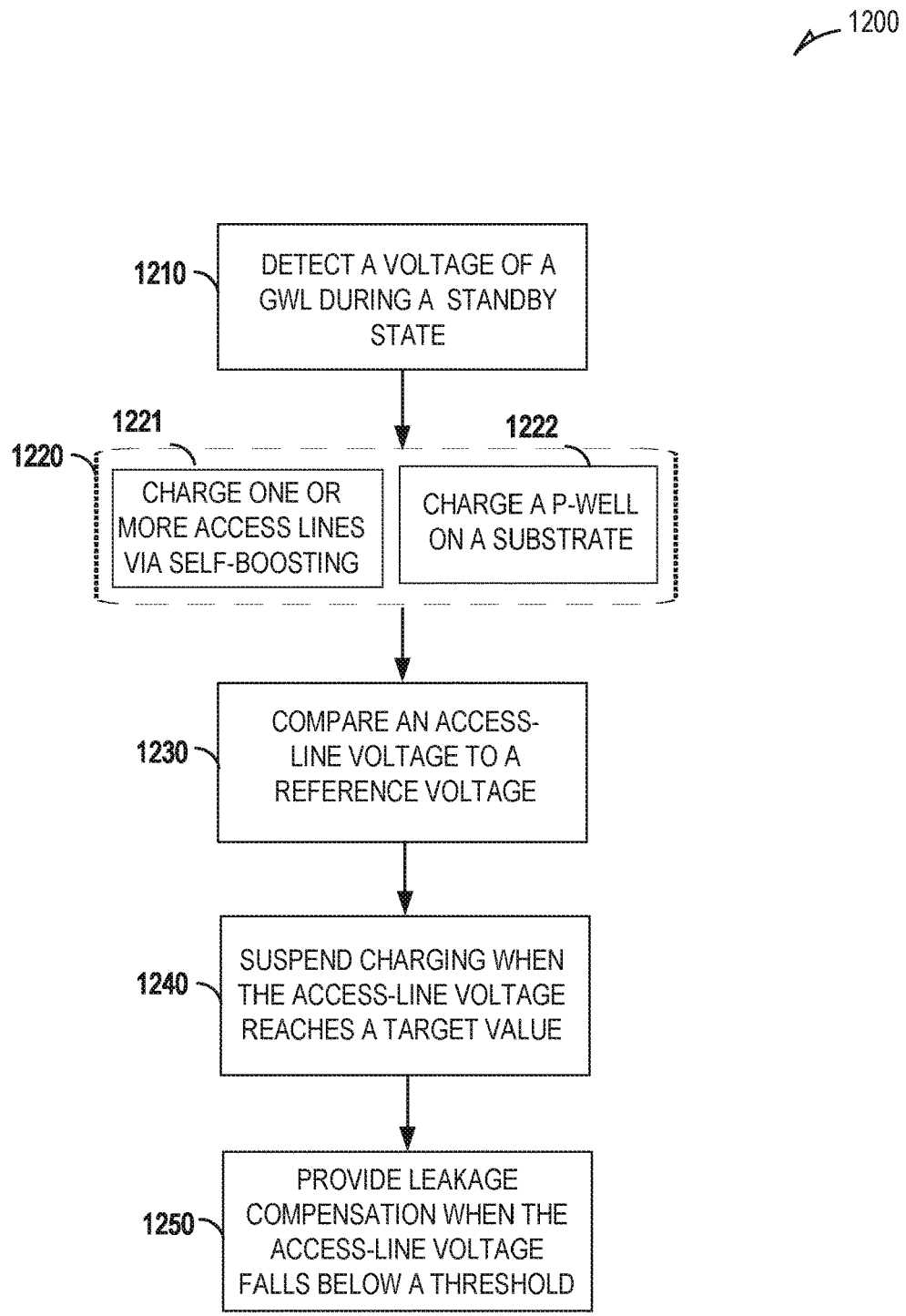
FIG. 12 is a flow chart illustrating a method of regulating voltages on one or more access lines in communication with an array of memory cells during a standby state.

FIG. 12 is a flow chart illustrating a method 1200 of regulating voltages on one or more access lines in communication with an array of memory cells during a standby state. The access lines may include a plurality of global word lines (GLWs) each configured for selective coupling to one or more local word lines (LWLs) communicatively coupled to the memory cells. The array of memory cells may include an array of non-volatile memory cells, such as NAND flash memory cells with their respective control gates coupled to the LWLs. In an example, the method 1200 may be implemented in and executed by the access line voltage regulation unit 500, or embodiments or variants thereof, such as the WL bias regulator 600 or the WL bias regulator 800, as discussed above.

The method 1200 commences at 1210 to receive an indication of standby state and detect a voltage of a global word line (GWL). The standby or idle state represents a state when a memory device is not in in a specific operational state (e.g. a program state, an erase state, or a read state). Such an indication may be provided by a system user via a user interface, or automatically determined and regulated by the state machine 510 as illustrated in FIG. 5.

At 1220, one or more access lines may be charged up to a desired voltage during the standby state. The charging may be in response to the detected voltage of the GWL falling below a reference voltage. Raising the access line voltage and maintaining it at a desired positive potential may mitigate charge loss occurring in memory devices such as floating gates of NAND flash memory cells during the standby state. As a higher potential may cause undesired effect of charge gain on some memory cells which may have a negative impact on the memory performance, access line voltages need to regulated and well-controlled during the standby state. Access line voltage regulation at 1220 is achieved by using the supply voltage $V_{CC}$, which is the only voltage source available during the standby state.

One of two different methods may be used to charge the access line to a desired voltage. In one method, at 1221, the access line is self-boosted such as by using the self-boosting circuit 680 coupled to the GWL charge driver 670, as a part of the WL bias regulator 600. Voltage boosting occurs through a plurality of HVNMOS transistors 680A-680N coupled to respective access lines. Due to self-boosting, the control gate voltage (HVG2 as shown in FIGS. 6-7) on the HVNMOS transistors 680A-680N is elevated to a level high enough to keep the HVNMOS transistors 68A-680N con-ductive throughout the standby state, no matter how high the targeted WL voltage is. This allows biasing voltage to be effectively transmitted to the access lines (e.g., GWLs) without any voltage drop.

Alternatively, at 1222, charges may be delivered to a common p-well in the region of the string drivers that operatively couple a GWL to, or decouple a GWL from, the corresponding LWL, such as the NMOS transistors 660A-660N, as a part of the WL bias regulator 800. During charging of the common p-well, high biasing voltage $V_{CC}$-Vth may be transmitted to the p-well. Such a voltage is high enough to forward-bias the PN-diode at the drain and source region (channel) of each of the NMOS devices 660A-660N. Accordingly, both GWLs and the LWLs may be charged up by the forward-biased PN-diode.

At 1230, access-line voltage may be sensed and compared to a reference voltage ($V_{REF}$). Such a comparison may be used to feedback-control the biasing voltage applied to the access line, such as implemented in the feedback charge control circuit 630 and the charging path 622, as illustrated in FIGS. 6 and 8. The $V_{REF}$ may be adjustable by a user, such as via the voltage divider 632. At 1240, when the access-line voltage such as that sampled from the GWL exceeds the $V_{REF}$, the feedback charge control circuit 630 outputs a high voltage that turns off the switch PMOS 623 to prevent or suspend the biasing voltage (at approximately $V_{CC}$) from being transmitted to the access lines.

At 1250, leakage compensation may be provided when the access line voltage falls below a threshold voltage. When the charging process at 1240 is shut off, charge leakage may occur at junctions of the access lines, such as in the drain and/or source regions of NMOS 640A-640N and the NMOS 660A-660N. Due to the junction leakage, the targeted voltage on the access lines may be left floating, wherein the voltage may drop. Leakage compensation at 1250 may be implemented in the compensation circuit 1000. When the access line voltage drops and reaches a specific threshold voltage, the leakage compensation circuit 1000 raises the access line potential back to a voltage close to the target level. In various examples, the leakage compensation process may be controlled by a first adjustable voltage threshold ($V_{Comp\_OFF}$) for turning off the leakage compensation, and a second adjustable voltage threshold ($V_{Comp\_ON}$) for turning on the leakage compensation. The access line voltage may be sampled continuously or periodically, and the leakage compensation circuit 1000 may maintain the access line voltage within a desired range between $V_{Comp\_ON}$ and $V_{comp\_OFF}$, such as illustrated by way of example in the timing diagram of FIG. 11. The leakage compensation may prevent or reduce charge loss during the standby state.

Figure 13:
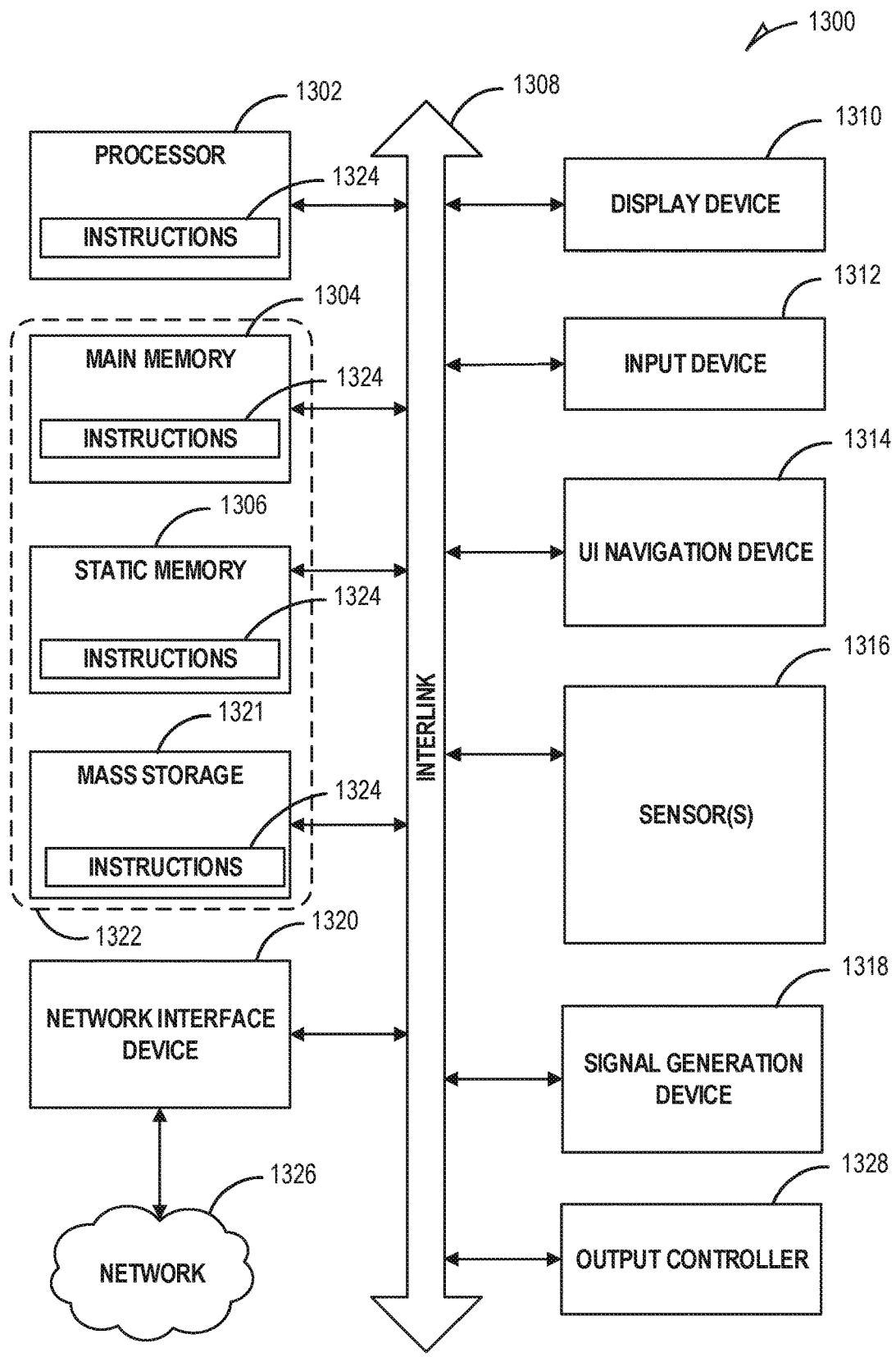
FIG. 13 is a block diagram illustrating an example of a machine upon which one or more embodiments may be implemented.

FIG. 13 illustrates a block diagram of an example machine 1300 upon which any one or more of the techniques (e.g., methodologies) discussed herein may perform. In alternative embodiments, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in peer-to-peer (P2P) (or other distributed) network environment. The machine 1300 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1300 (e.g., the host device 105, the memory device 110, etc.) may include a hardware processor 1302 (e.g., a central processing unit (CPU), a graphics processing unit (GPU), a hardware processor core, or any combination thereof, such as the memory controller 115, etc.), a main memory 1304 and a static memory 1306, some or all of which may communicate with each other via an interlink (e.g., bus) 1308. The machine 1300 may further include a display unit 1310, an alphanumeric input device 1312 (e.g., a keyboard), and a user interface (UI) navigation device 1314 (e.g., a mouse). In an example, the display unit 1310, input device 1312 and UI navigation device 1314 may be a touch screen display. The machine 1300 may additionally include a signal generation device 1318 (e.g., a speaker), a network interface device 1320, and one or more sensors 1316, such as a global positioning system (GPS) sensor, compass, accelerometer, or other sensor. The machine 1300 may include an output controller 1328, such as a serial (e.g., universal serial bus (USB), parallel or other wired or wireless (e.g., infrared (IR), near field communication (NFC), etc.) connection to communicate or control one or more peripheral devices (e.g., a printer, card reader, etc.).

The machine 1300 may include a machine readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within static memory 1306, or within the hardware processor 1302 during execution thereof by the machine 1300. In an example, one or any combination of the hardware processor 1302, the main memory 1304, or the static memory 1306 may constitute the machine readable medium 1322.

While the machine readable medium 1322 is illustrated as a single medium, the term "machine readable medium" may include a single medium or multiple media (e.g., a centralized or distributed database, or associated caches and servers) configured to store the one or more instructions 1324.

The term "machine readable medium" may include any medium capable of storing or encoding instructions for execution by the machine 1300 and that cause the machine 1300 to perform any one or more of the techniques of the present disclosure, or capable of storing, encoding or carrying data structures used by or associated with such instructions. Non-limiting machine readable medium examples include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1324 (e.g., software, programs, an operating system (OS), etc.) or other data are stored on the storage device 1321, can be accessed by the memory 1304 for use by the processor 1302. The memory 1304 (e.g., DRAM) is typically fast, but volatile, and thus a different type of storage than the storage device 1321 (e.g., an SSD), which is suitable for long-term storage, including while in an "off" condition. The instructions 1324 or data in use by a user or the machine 1300 are typically loaded in the memory 1304 for use by the processor 1302. When the memory 1304 is full virtual space from the storage device 1321 can be allocated to supplement the memory 1304; however, because the storage 1321 device is typically slower than the memory 1304, and write speeds are typically at least twice as slow as read speeds, use of virtual memory can greatly reduce user experience due to storage device latency (in contrast to the memory 1304, e.g., DRAM). Further, use of the storage device 1321 for virtual memory can greatly reduce the usable lifespan of the storage device 1321.

In contrast to virtual memory, virtual memory compression (e.g., the Linux® kernel feature "ZRAM") uses part of the memory as compressed block storage to avoid paging to the storage device 1321. Paging takes place in the compressed block until it is necessary to write such data to the storage device 1321. Virtual memory compression increases the usable size of memory 1304, while reducing wear on the storage device 1321.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1324 may further be transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1320 may include one or more physical jacks (e.g., Ethernet, coaxial, or phone jacks) or one or more antennas to connect to the communications network 1326. In an example, the network interface device 1320 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1300, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a memory device, comprising: an array of memory cells; an access line in communication with the array of memory cells; and a control circuit configured to couple, in a standby state, a supply voltage (VCC) to the access line to charge the access line to a positive bias potential.

In Example 2, the subject matter of Example 1 optionally includes the access line that may include a plurality of global word lines (GLWs) each configured for selective coupling to one or more local word lines (LWLs). The array of memory cells include an array of NAND memory cells each having respective control gates coupled to the LWLs.

In Example 3, the subject matter of Example 2 optionally includes the array of NAND memory cells that may be arranged in a two-dimensional (2D) or a three-dimensional (3D) architecture.

In Example 4, the subject matter of any one or more of Examples 1-3 optionally includes a charging circuit configured to charge the access line via self-boosting.

In Example 5, the subject matter of Example 4 optionally includes the charging circuit that may include an array of high-voltage N-type metal-oxide-semiconductor (HVNMOS) transistors.

In Example 6, the subject matter of any one or more of Examples 2-5 optionally includes the GWLs that are each controllably coupled to respective LWLs via respective MOS transistors. The memory device comprises a charging circuit configured to charge a p-well on a substrate of the array of memory cells to forward-bias a PN-diode at the respective MOS transistors.

In Example 7, the subject matter of Example 6 optionally includes the charging circuit that may include a PMOS/NMOS pair to transmit a target bias voltage to the p-well.

In Example 8, the subject matter of any one or more of Examples 1-7 optionally includes a comparator circuit configured to compare an access line voltage on an access line to a reference voltage. The control circuit is configured to charge the access line based on the comparison between the access line voltage and the reference voltage.

In Example 9, the subject matter of Example 8 optionally includes the control circuit that may be configured to charge the access line until the access line voltage reaches in value to the reference voltage.

In Example 10, the subject matter of any one or more of Examples 1-9 optionally includes the standby state that may be separate from a program state, an erase state, and a read state.

In Example 11, the subject matter of any one or more of Examples 1-10 optionally includes a leakage compensation circuit, and the control circuit may be configured to operatively couple the access line to the leakage compensation circuit to maintain the access line voltage at the access line to be substantially equal to the positive bias potential.

In Example 12, the subject matter of Example 11 optionally includes the control circuit that may be configured to switch the coupling from the charging circuit to the leakage compensation circuit when the access line voltage falls below a threshold voltage.

Example 13 is a method of regulating voltages on access lines in communication with an array of memory cells. The method comprises steps of: receiving an indication of a standby state; and in response to receiving the indication of the standby state, coupling a supply voltage (VCC) to an access line to charge the access line to a positive bias potential.

In Example 14, the subject matter of Example 13 optionally includes, wherein the access line includes a plurality of global word lines (GLWs) each configured for selective coupling to one or more local word lines (LWLs), and the array of memory cells include an array of NAND memory cells each having respective control gates coupled to the LWLs.

In Example 15, the subject matter of any one or more of Examples 13-14 optionally includes charging the access line includes using a charging circuit including a high-voltage N-type metal-oxide-semiconductor (HVNMOS) transistor to charge the access line via self-boosting.

In Example 16, the subject matter of any one or more of Examples 13-15 optionally includes charging a p-well on a substrate of the array of memory cells.

In Example 17, the subject matter of Example 16 optionally includes charging the p-well which may include transmitting a target bias voltage to the p-well using a PMOS/NMOS pair.

In Example 18, the subject matter of any one or more of Examples 13-17 optionally includes comparing an access line voltage on an access line to a reference voltage, and charging the access line based on the comparison between the access line voltage and the reference voltage.

In Example 19, the subject matter of any one or more of Examples 13-18 optionally include the standby state that is separate from a program state, an erase state, and a read state.

In Example 20, the subject matter of any one or more of Examples 13-19 optionally includes detecting the access line voltage, and switching the coupling from the charging circuit to the leakage compensation circuit when the access line voltage falls below a threshold voltage.

Example 21 is a memory device comprising: a memory cell; a string driver circuit coupled to the memory cell via a local word line (LWL), the string driver circuit having a common p-well; and a charging circuit configured to couple, in response to a voltage of a global word line (GWL) of the memory device falling below a reference voltage during a standby state, a supply voltage (VCC) to the common p-well of the string driver circuit to charge the GWL to a positive bias potential.

In Example 22, the subject matter of Example 21 optionally includes the string driver circuit that is coupled between the GWL and the LWL, and to the memory cell using the LWL. The memory cell may include a NAND memory cell having a control gate coupled to the LWL.

In Example 23, the subject matter of Example 22 optionally includes the string driver circuit that may include a metal-oxide-semiconductor (MOS) transistor, and the charging circuit may be configured to charge the common p-well of the string driver circuit to forward-bias a PN-diode of the MOS transistor.

In Example 24, the subject matter of Example 23 optionally includes the charging circuit that may include a PMOS/NMOS pair to transmit a target bias voltage to the common p-well, and the common p-well of the string driver circuit may be a common p-well of a substrate of the memory device.

In Example 25, the subject matter of any one or more of Examples 21-24 optionally includes a comparator circuit configured to compare the voltage of the GWL to the reference voltage. The control circuit may be configured to charge the GWL based on the comparison between the voltage of the GWL and the reference voltage.

In Example 26, the subject matter of Example 25 optionally includes the charging circuit that may be configured to charge the GWL until the voltage of the GWL reaches the value of the reference voltage.

In Example 27, the subject matter of any one or more of Examples 25-26 optionally includes the comparator circuit that may be configured to output a control signal to shut off active circuits on the memory device in response to the voltage of the GWL reaching the value of the reference voltage.

In Example 28, the subject matter of any one or more of Examples 21-27 optionally includes the standby state separate from a program state, an erase state, and a read state.

In Example 29, the subject matter of any one or more of Examples 21-28 optionally include a leakage compensation circuit coupled to the GWL to compensate for junction leakage at the GWL and to maintain the voltage of the GWL to be substantially equal to the positive bias potential.

In Example 30, the subject matter of Example 29 optionally includes the leakage compensation circuit that may include a diode-connected current path.

In Example 31, the subject matter of any one or more of Examples 29-30 optionally includes the leakage compensation circuit configured to couple to the GWL in response to the voltage of the GWL voltage falling below an adjustable threshold voltage.

In Example 32, the subject matter of any one or more of Examples 21-31 optionally includes a self-boosting circuit coupled between the charging circuit and the GWL. The charging circuit may be configured to charge the GWL via the self-boosting circuit.

In Example 33, the subject matter of Example 32 optionally includes the self-boosting circuit that may include a high-voltage N-type metal-oxide-semiconductor (HVNMOS) transistor.

Example 34 is a memory device, comprising: an NAND memory cell array; a string driver circuit coupled to the NAND memory cell array via a plurality of local word lines (LWLs), the string driver circuit having a common p-well; and a memory control circuit coupled to the NAND memory cell array and the string driver circuit, the memory control circuit configured to: during a memory operational state, apply specific voltages to the LWLs to program, erase, or read a NAND memory cell from the NAND memory cell array; and during a standby state, couple a supply voltage (VCC) to the common p-well of the string driver circuit in response to a voltage of a global word line (GWL) of the memory device falling below a reference voltage, and charge the GWL to a positive bias potential.

Example 35 is a method of regulating a standby-state voltage of a global word line (GWL) of a memory device having a string driver circuit coupled to a memory cell. The method comprises steps of: detecting a voltage of the GWL during a standby state; and in response to the voltage of the GWL falling below a reference voltage, coupling a supply voltage (VCC) to a common p-well of the string driver circuit to charge the GWL to a positive bias potential.

In Example 36, the subject matter of Example 35 optionally includes charging the GWL by transmitting a target bias voltage to the p-well using a PMOS/NMOS pair.

In Example 37, the subject matter of any one or more of Examples 35-36 optionally includes charging the GWL via self-boosting using a charging circuit that includes a high-voltage N-type metal-oxide-semiconductor (HVNMOS) transistor.

In Example 38, the subject matter of any one or more of Examples 35-37 optionally include comparing the voltage of the GWL to a reference voltage, and charging the GWL based on the comparison between the access line voltage and the reference voltage.

In Example 39, the subject matter of any one or more of Examples 35-38 optionally includes generating a control signal to shut off active circuits on the memory device in response to the voltage of the GWL reaching the value of the reference voltage.

In Example 40, the subject matter of any one or more of Examples 35-39 optionally includes, in response to the voltage of the GWL falling below an adjustable threshold voltage, charging the GWL to compensate for junction leakage at the GWL.

The invention claimed is:

1. A memory device, comprising:
   a memory cell;
   a charging circuit configured to charge an access line coupled to the memory cell; and
   a self-boosting circuit coupled between the charging circuit and the access line, the self-boosting circuit including an array of transistors each coupled to a respective access line;
   wherein the charging circuit is configured to couple a charging voltage to the access line via the self-boosting circuit in response to a voltage of the access line falling below a reference voltage during a standby state, and to charge the access line to a positive bias potential.

2. The memory device of claim 1, wherein the charging circuit is configured to charge one or more access lines using respective one or more of the array of transistors.

3. The memory device of claim 2, wherein the charging circuit is configured to apply a gate control signal to gates of the one or more of the array of transistors to keep the one or more of the array of transistors conductive throughout the standby state.

4. The memory device of claim 2, wherein the array of transistors of the self-boosting circuit include high-voltage N-type metal-oxide-semiconductor (HVNMOS) transistors.

5. The memory device of claim 1, wherein the access line includes a global word line (GWL).

6. The memory device of claim 1, wherein the charging voltage for charging the access line includes a supply voltage ($V_{CC}$), a charge pump, or an external supply voltage.

7. The memory device of claim 1, comprising a string driver circuit coupled between the access line and a local word line (LWL), and to the memory cell via the LWL, wherein the memory cell includes a NAND memory cell having a control gate coupled to the LWL.

8. The memory device of claim 1, comprising a comparator circuit configured to compare the voltage of the access line to the reference voltage, wherein the control circuit is configured to charge the access line based on the comparison between the voltage of the access line and the reference voltage.

9. The memory device of claim 8, wherein the charging circuit is configured to charge the access line until the voltage of the access line reaches the value of the reference voltage.

10. The memory device of claim 8, wherein the comparator circuit is configured to output a control signal to shut off active circuits on the memory device in response to the voltage of the access line reaching the value of the reference voltage.

11. The memory device of claim 1, comprising a leakage compensation circuit coupled to the access line to compensate for junction leakage at the access line and to maintain the voltage of the access line to be substantially equal to the positive bias potential.

12. The memory device of claim 11, wherein the leakage compensation circuit includes a diode-connected current path.

13. The memory device of claim 11, wherein, the leakage compensation circuit is configured to couple to the access line in response to the access line voltage falling below an adjustable threshold voltage.

14. A memory device, comprising:
   an NAND memory cell array;
   a string driver circuit coupled to the NAND memory cell array via a plurality of local word lines (LWLs); and
   a memory control circuit coupled to the NAND memory cell array and the string driver circuit, the memory control circuit configured to:
   during a memory operational state, apply specific voltages to the LWLs to program, erase, or read a NAND memory cell from the NAND memory cell array; and
   during a standby state, couple a charging voltage to an access line of the memory device via a self-boosting circuit in response to a voltage of the access line falling below a reference voltage, and charge the access line to a positive bias potential.

15. A method of regulating a standby-state voltage of an access line of a memory device, the method comprising:
   detecting a voltage of the access line during a standby state; and
   in response to the voltage of the access line falling below a reference voltage, coupling a charging voltage to the access line via a self-boosting circuit to charge the access line to a positive bias potential, the self-boosting circuit including an array of transistors each coupled to a respective access line.

16. The method of claim 15, wherein charging the access line is through one or more transistors of the self-boosting circuit each coupled to a respective access line.

17. The method of claim 16, wherein charging the access line includes applying a gate control signal to gates of the one or more transistors of the self-boosting circuit to keep the one or more transistors conductive throughout the standby state.

18. The method of claim 15, comprising:
   comparing the voltage of the access line to a reference voltage; and
   charging the access line based on the comparison between the access line voltage and the reference voltage.

19. The method of claim 15, comprising generating a control signal to shut off active circuits on the memory device in response to the voltage of the access line reaching the value of the reference voltage.

20. The method of claim 15, comprising, in response to the voltage of the access line falling below an adjustable threshold voltage, charging the access line to compensate for junction leakage at the access line.

* * * * *